United States Patent [19]

Takeuchi et al.

[11] Patent Number: 4,953,123

[45] Date of Patent: Aug. 28, 1990

[54] MEMORY SYSTEM TO PERFORM DATA TRANSFER BY A CONTACTLESS ELECTROMAGNETIC INDUCTION COUPLING SYSTEM USING INDUCTION COILS

[75] Inventors: Kunihiko Takeuchi, Kawasaki; Masao Oba, Yokohama; Shinichi Horinouchi, Tokyo, all of Japan

[73] Assignee: Tokyo Keiki Company, Ltd., Tokyo, Japan

[21] Appl. No.: 297,579

[22] Filed: Jan. 17, 1989

[30] Foreign Application Priority Data

Jan. 18, 1988 [JP] Japan .................................... 63-8186

[51] Int. Cl.⁵ ............................ G11C 7/00; H04J 1/00
[52] U.S. Cl. ......................................... 365/66; 365/52; 365/226; 370/69.1
[58] Field of Search .................... 365/226, 185, 52, 66, 365/230.02, 189.02; 370/69.1, 76; 364/478, 468

[56] References Cited

U.S. PATENT DOCUMENTS 4,506,348 3/1985 Miller et al. ..................... 365/230.02

FOREIGN PATENT DOCUMENTS

54-59825 5/1979 Japan .................................... 365/226

Primary Examiner—Stuart N. Hecker
Assistant Examiner—Alfonso Garcia
Attorney, Agent, or Firm—Wenderoth, Lind & Ponack

[57] ABSTRACT

A control signal used to write access or read access and data are transmitted between a write/read unit and a memory module by a contactless coupling using induction coils. The write/read unit multiplexes a control signal consisting of three signals including a power source signal, sync clocks, and enable clocks using frequency modulation and supplies the resultant multiplexed signal to one end of the induction coil for transmission. The write/read unit frequency modulates access data and supplies same to the other end of the same induction coil for transmission. The transmitting coil in the memory module allows the signal which is obtained by adding an access signal to the control signal to be induced in the coil for reception in the write/read unit. The read data from the memory module is frequency modulated and sent from the memory module to the write/read unit by using the transmitting and receiving coils for a down-signal which is used only to read out data.

6 Claims, 6 Drawing Sheets

FIG. 3A READ

FIG. 3B WRITE

FIG. 3C ERASE

FIG.4A  SHIFT CLOCK

FIG.4B  ENABLE CLOCK

FIG.4C  ENABLE SIGNAL

FIG. 5

FIG. 6

MEMORY SYSTEM TO PERFORM DATA TRANSFER BY A CONTACTLESS ELECTROMAGNETIC INDUCTION COUPLING SYSTEM USING INDUCTION COILS

BACKGROUND OF THE INVENTION

The present invention relates to a memory package system in which data is written or read out by a contactless induction coupling between a memory module having a memory therein and a write/ read unit.

In now abandoned U.S. application Ser. No. 07/048832, 07/053759 and in U.S. Pat. No. 4,821,198, the inventors of the present invention have already proposed a system in which in order to write and read data into and out of a non-volatile memory such as an EEPROM which is provided in a memory module by using a write/read unit in a contactless manner, induction coils are provided in both the write/read unit and the memory module, and when data is written in or read out, both of the induction coils are arranged so as to face each other at a predetermined gap interval and both electrical power for operation and serially transmitted write/read data are supplied to the memory module by electromagnetic induction coupling.

In such a power supply to the memory module and a data transmission to write or read in the contactless induction coupling system, when the kinds of signals increase, the number of induction coils in the write/read unit and memory module increases. Therefore, in the above-noted system, a start-stop communication system which does not need to transmit transmission/reception sync clocks (shift clocks) is used as a communication system for transmitting serial data and for converting same into parallel data. That is, it is sufficient that three kinds of signals consisting of a power source signal which is transmitted from the write/read unit to the memory module, an up-signal to write or read, and a down-signal serving as read data which is returned from the memory module to the write/read unit are transmitted between the write/read unit and the memory module.

Furthermore, to reduce the number of induction coils, when the power source signal and up-signal are transmitted to the memory module, they are multiplexed by using the same induction coil. It is sufficient to use two sets of induction coils consisting of a pair of induction coils for the power source signal and up-signal and another pair of induction coils for the down signal.

However, in the start-stop communication system, a communication control circuit for a start-stop communication control which is known as a USART needs to be provided for each of the write/read unit and memory module. In such a type of memory package system, the miniaturization of the memory module is required. However, the start-stop communication system has a problem in that the memory module increases in size by only the amount corresponding to the communication control circuits which are necessary.

On the other hand, in the start-stop communication control system, since the shift clocks reproduced from a reception signal and data bits received are synchronized and the received serial data is converted into the parallel data, a data error easily occurs as compared with the case of using transmission/reception sync clocks. Therefore, it is certainly necessary to perform an error control method such as a parity check or the like. There is also a problem in that when an error is detected, a retransmission request is repetitively generated until the correct data can be received, so that the communication time to write or read becomes long.

SUMMARY OF THE INVENTION

It is an object of the present invention to provide a memory package system for performing a two-way data transmission between a write/read unit and a memory module by a contactless induction coupling using a simple circuit arrangement.

Another object of the invention is to provide a memory package system in which the two-way data transmission can be executed between a write/read unit and a memory module without increasing the number of induction coils for the contactless induction coupling.

Still another object of the invention is to provide a memory package system in which the two-way data transmission can be executed between a write/read unit and a memory module without needing special communication control circuits as in the case of the start-stop communication system.

Still another object of the invention is to provide a memory package system in which a power source signal, transmission/reception sync clocks, enable clocks, write and read commands, and write data are multiplexed by a write/read unit and are serially transmitted to a memory package system, and the serial data is reproduced by a memory package, and clocks and an enable signal which are necessary to write access or read access, a write command and write data, and a read command are produced.

Still another object of the invention is to provide a memory package system comprising: a pair of induction coils (for up-transmission) for transmitting, from a write/read unit to a memory module, a signal obtained by multiplexing four kinds of signals consisting of a power source signal, transmission/reception sync clocks, enable clocks, and write access data composed of a write command and write data in a write access mode or a signal obtained by multiplexing four kinds of signals consisting of the power source signal, transmission/reception sync clocks, enable clocks, and a write command in a read access mode; and another pair of induction coils (for down-transmission) for transmitting only serially converted read data from the memory module to the write/read unit.

That is, according to the present invention, after three signals consisting of the power source signal to supply electrical power for operation to a memory package, transmission/reception sync clocks, and enable clocks were frequency modulated by the write/read unit, they are time sharingly multiplexed and transmitted to the memory module by the pair of induction coils for up-transmission by the contactless induction coupling.

On the other hand, with respect to the write access data consisting of the write command, write addresses, and write data or the read access data consisting of a read command and read addresses, the serial bit data of the write access data or read access data is frequency modulated by the write/read unit and added by the pair of induction coils for up-transmission and transmitted to the memory module.

On the other hand, with respect to the read data from memory module in the read access mode, the read data is frequency modulated and transmitted to the write/- read unit by using the pair of induction coils only for down-transmission by the contactless induction coupling.

Further, the induction coils for up-transmission are coils of a large diameter wound in the coil grooves formed on the outer peripheral side of the magnetic core concentrically having two coil grooves. The induction coils for down-transmission are coils of a small diameter wound in the coil grooves formed on the inner peripheral side of the same magnetic core.

According to such a construction of the present invention, four signals consisting of the power source signal, transmission/reception sync clocks, enable clocks, and frequency modulated signal of the write access data or read access data applied to the coils, which signals were time sharingly multiplexed after completion of the frequency modulation, are transmitted through the induction coils only for up-transmission to the memory module. Thus, the operating power source to the memory module is obtained by rectifying all of the four reception signals. On the other hand, the transmission/reception sync clocks, enable clocks, write access data, or read access data can be individually demodulated from the frequency signal induced in the induction coils only for up-transmission.

Therefore, without needing any special communication control circuit, the data reading operation based on the read access data by the induction coils or the data writing operation based on the write access data can be performed for a memory such as an EEPROM by a simple circuit.

Thus, since the transmission/reception sync clocks (shift clocks) are transmitted, the memory module can be miniaturized by only the amount corresponding to the special communication control circuit which is necessary for the serial/parallel conversion as in the case of the start-stop communication system. On the other hand, since the transmission/reception sync clocks are transmitted, the reliability in data transmission is improved. The error control as in the case of the start-stop communication system is unnecessary. The communicating time to write or read out data is short.

Further, coils of a large diameter which are wound in the coil grooves formed on the outer peripheral side of the magnetic core concentrically having two coil grooves are used as the induction coils for up-transmission. Therefore, the induction magnetic field of a sufficiently large intensity can be generated. Even if the gap length between the pair of induction coils increases, the up-signal and power source can be certainly supplied to the memory module.

These and other objects, features, and advantages of the invention will become more apparent from the following detailed description taken in conjunction with the accompanying drawings.

DETAILED DESCRIPTION OF A PREFERRED EMBODIMENT

Figure 1:
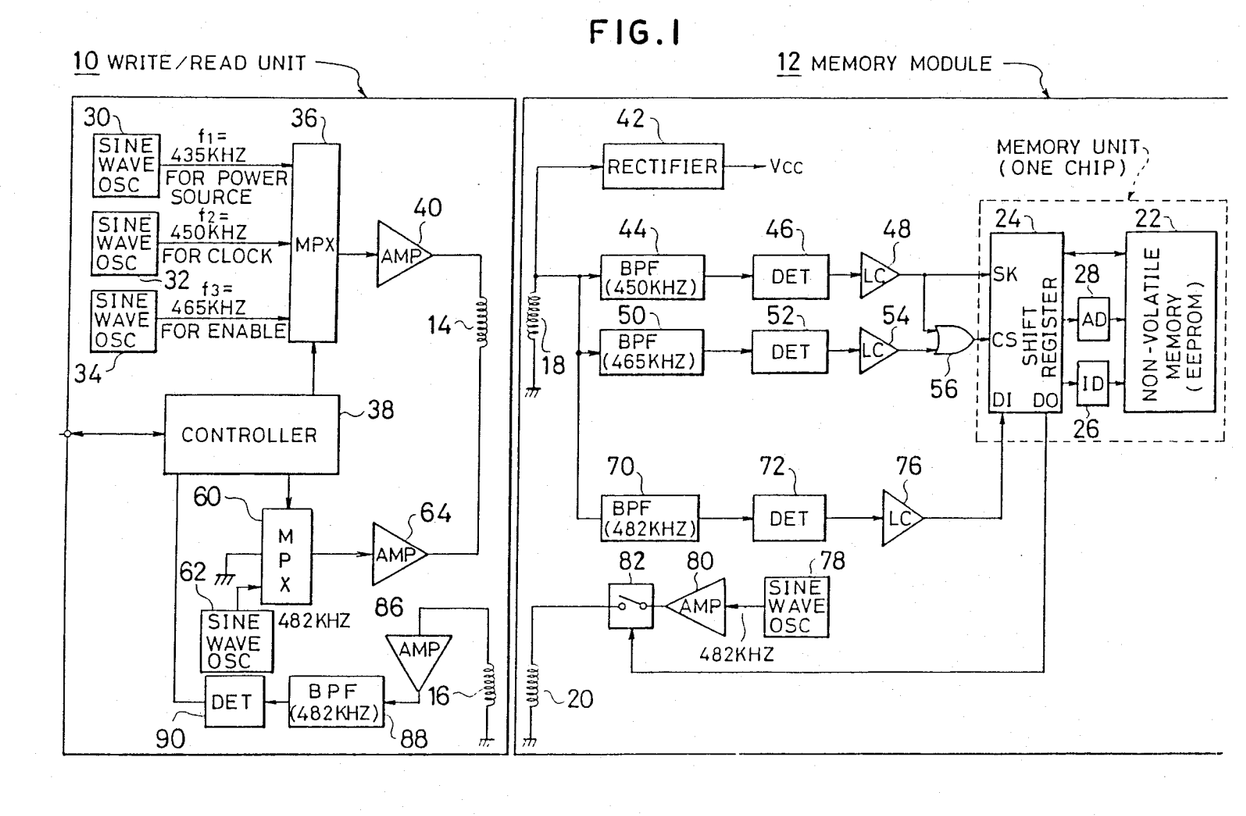
FIG. 1 is a system block diagram showing an embodiment of the present invention.

In FIG. 1, reference numeral 10 denotes a write/read unit and reference numeral 12 indicates a memory module having a memory, which may be a non-volatile memory, therein.

The write/read unit 10 has a first induction coil 14 to transmit both a power source signal and up-signals to the memory module 12 and a second induction coil 16 to receive read data which was read out of the non-volatile memory in the memory module 12.

The up-signals by the induction coil 14 include the following five kinds of signals.

(a) A power source clock signal to supply operating electrical power;

(b) A clock signal for transmission/reception synchronization;

(c) A clock signal to enable operation;

(d) Write access data consisting of a write command, write addresses, and write data;

(e) Read access data consisting of a read command and read addresses;

On the other hand, the down-signal by the induction coil 16 consists of only the read data from the memory module 12.

Figure 2:
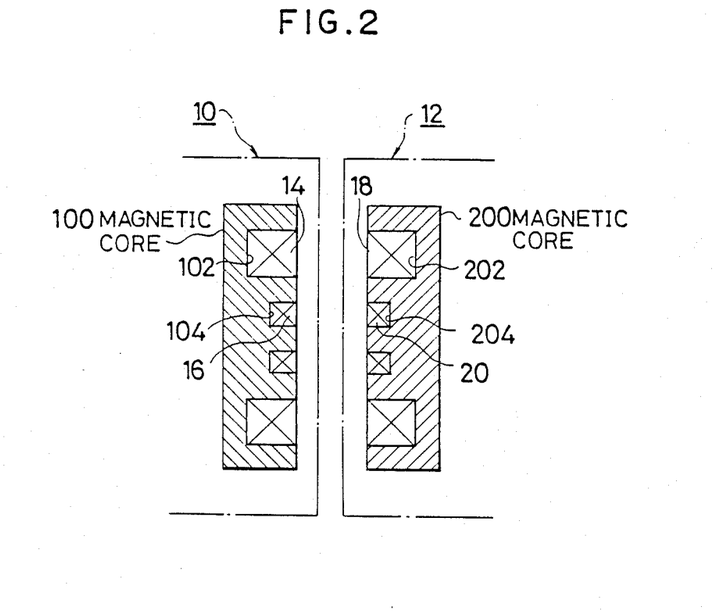
FIG. 2 is an explanatory diagram of a magnetic induction coupling apparatus which is used in the embodiment in FIG. 1.

Further, the induction coils 14 and 16 provided in the write/read unit 10 are wound around a same magnetic core 100 as shown in FIG. 2. That is, the magnetic core 100 provided in the write/read unit 10 concentrically has two coil grooves 102 and 104 which open to the surface on the side of the memory module 12. The induction coil 14 for up-transmission is wound in the coil groove 102 on the outer peripheral side. The induction coil 16 for down-transmission is wound in the coil groove 104 on the inner peripheral side. Therefore, the diameter of induction coil 14 for up-transmission and the number of turns thereof are sufficiently larger than those of the induction coil 16 for down-transmission. Thus, the induction magnetic field of an enough large intensity to transmit the up-signals to the memory module 12 by the electromagnetic induction coupling can be generated by the induction coil 14.

Returning to FIG. 1, a third induction coil 18, provided in the memory module 12, is arranged so as to face the first induction coil 14 at a predetermined gap. The first induction coil 14 is provided in the write/read unit 10 to supply a power source signal and to transmit the up-signals. The power source signal and up-signals can be transmitted from the write/read unit 10 to the memory module 12 by the contactless induction coupling by using the induction coils 14 and 18. On the other hand, a fourth induction coil 20 is provided in the memory module 12 so as to face the second induction coil 16 in the write/read unit 10 at a predetermined gap. The read data which was read out of the memory module 12 can be returned as a down-signal to the write/ read unit 10 by the contactless induction coupling by using the induction coils 16 and 20.

As shown in FIG. 2, the induction coils 18 and 20 provided in the memory module 12 are also wound around the same magnetic core 200. That is, the magnetic core 200 concentrically has two coil grooves 202 and 204 which open on the side of the write/read unit 10. The third induction coil 18 for reception of the up-signals is wound in the coil groove 202 on the outer peripheral side. The fourth induction coil 20 for transmission of the down-signal is wound in the coil groove 204 on the inner peripheral side. The diameter and the number of turns of the third induction coil 18 wound in the coil groove 202 on the outer peripheral side can be set to large values as compared with those of the fourth induction coil 20 wound in the coil groove 204 on the inner peripheral side. Thus, a large enough induced signal can be generated due to the large induction magnetic field generated by the induction coil 14 of the write/read unit 10.

Referring again to FIG. 1, a non-volatile memory 22 using an EEPROM is assembled in the memory module 12. The non-volatile memory 22 has a shift register 24 in the same chip. The shift register 24 converts the write data serially transmitted from the outside into the parallel data and also converts the parallel data read out of the memory 22 into the serial data and transmits same.

As a memory unit in which the shift register 24 for performing the serial/parallel conversion is assembled in the same chip as mentioned above, for instance, it is possible to use an EEPROM having a communicating function such as Part No. NMC 9306 made by National Semiconductor Co., Ltd., or Part No. X2404 made by XICOR Co., Ltd., or the like.

For example, when Part No. NMC 9306 made by National Semiconductor Co., Ltd. is used as a memory unit having therein the non-volatile memory 22, as shown in FIG. 1, the shift register 24 has a shift clock terminal SK, a chip selecting terminal (enable terminal) CS, a serial data input terminal DI, and a serial data output terminal DO. When a shift clock is supplied to the shift clock terminal SK in the enable state in which the chip selecting terminal CS is set to a high (H) level, the shift register 24 reads the serial data fed to the serial data input terminal DI synchronously with the shift clock and converts the data into parallel data and can control the writing and reading operations for the non-volatile memory 22. On the other hand, an instruction decoder 26 for decoding a write command and a read command and an address decoder 28 for designating a write address or a read address are arranged between the shift register 24 and the memory 22.

Figure 3A:
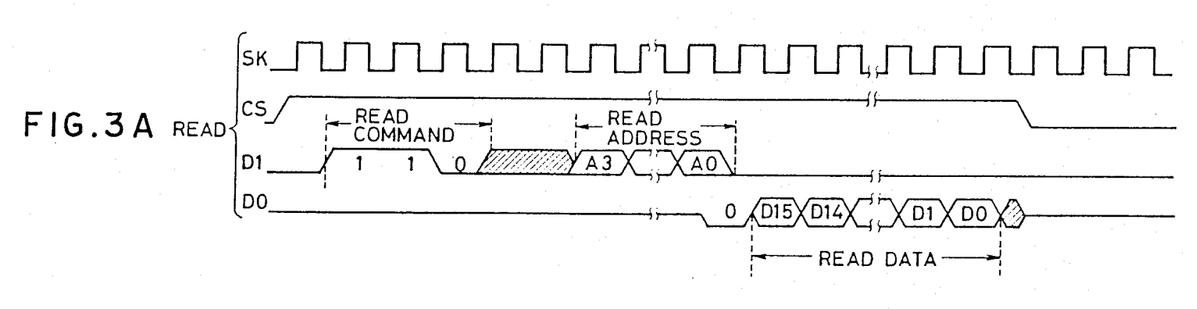
FIG. 3A is a timing chart showing the read control of a memory module.
Figure 3B:
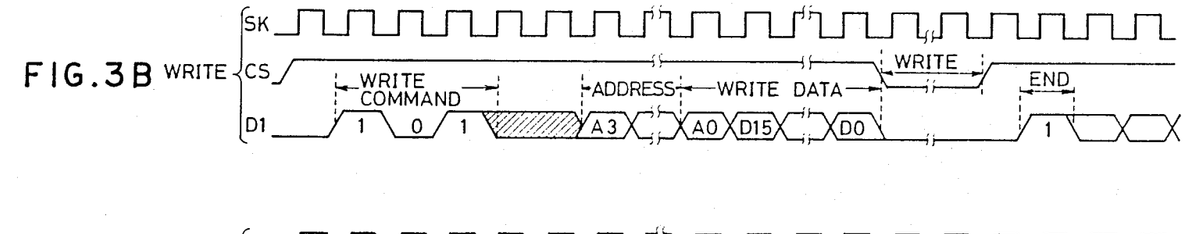
FIG. 3B is a timing chart showing the write control of the memory module.
Figure 3C:
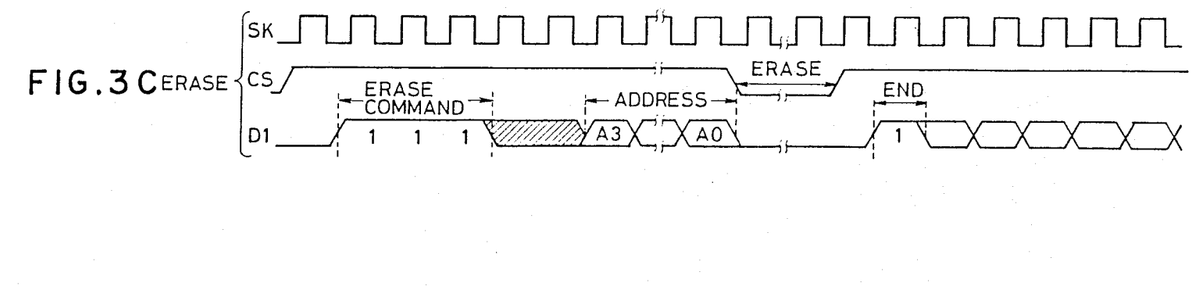
FIG. 3C is a timing chart showing the erase control of the memory module.

FIGS. 3A, 3B, and 3C are time charts showing the read control, write control, and erase control for the non-volatile memory 22 by the shift register 24 assembled in the memory module 12 in FIG. 1, respectively.

First, in the read control mode shown in FIG. 3A, by setting the chip selecting terminal CS to the H level in a state in which a shift clock is supplied to the shift clock terminal SK, the enable state in which data input from the serial data input terminal DI can be written is derived. In this state, when a read command "110" consisting of three bits and arbitrary read addresses "$A_3, A_2, A_1, A_0$" consisting of four bits are fed to the serial data input terminal DI, each bit of the read command and read addresses is converted into parallel data synchronously with the shift clock SK. The read command is decoded by the instruction decoder 26 and the reading mode is set into the non-volatile memory 22. The read addresses are decoded by the address decoder 28 and the decoded read addresses are designated in the memory 22. When the read command and read addresses converted into the parallel data by the shift register 24 are fed to the memory 22, the memory 22 reads out the stored data of sixteen bits from the instruction addresses and transfers it to the shift register 24. Upon reception of the transferred read data, the shift register 24 sequentially converts the read data into serial data and outputs it in accordance with the order of $D_{15}$ to $D_0$ from the serial data output terminal DO synchronously with the shift clocks SK.

Next, in the write control mode shown in FIG. 3B, in a manner similar to the read control, by setting the chip selecting terminal CS to the H level in the state in which a shift clock is supplied to the shift clock terminal SK, the enable state can be formed. In the enable state, when a write command "010", write addresses "$A_3$ to $A_0$", and write data "$D_{15}$ to $D_0$" are given to the serial data input terminal DI, the write command, write addresses, and write data are sequentially converted into parallel data synchronously with the shift clocks in accordance with this order. The write command is decoded by the instruction decoder 26 and the memory 22 is set into the writing mode. The write addresses which are subsequently obtained are decoded by the address decoder and the write addresses are designated. The parallel converted outputs of the finally obtained write data are written into the instruction addresses.

Furthermore, in the erase control mode shown in FIG. 3C, the enable state is formed by supplying a shift clock to the shift clock terminal SK and by setting the chip selecting terminal CS to the H level. In the enable state, an erase command "111" obtained at the serial data input terminal DI is converted into parallel data synchronously with the shift clocks. The erase command is decoded by the instruction decoder 26. The stored content in the designated addresses is erased on the basis of the decoded erase command. In the read control mode of FIG. 3A, after completion of the serial output of the read data $D_{15}$ to $D_0$, the chip selecting terminal CS is set to an L level and a disable state is set. On the other hand, in the write control mode of FIG. 3B, after completion of the serial/parallel conversion of the write data, the chip selecting terminal CS is set to the L level and during this period of time, the parallel converted data is written from the shift register 24 into the non-volatile memory 22. Furthermore, in the erase control mode of FIG. 3C, after completion of the parallel conversion of the address data "$A_3$ to $A_0$", the chip selecting terminal CS is set to the L level and the designated addresses are erased during this period of time. Moreover, in the write control modes and erase control, when the data writing operation or the data erasing operation is finished by setting the chip selecting terminal CS to the L level, the chip selecting terminal CS is again set to the H level. Finally, when an end command obtained at the serial data input terminal DI is received, one write control mode or erase control is finished.

In the write/read unit 10 in FIG. 1 for the memory module 12 to perform the write, read, or erase control by the shift clocks and chip selection signal shown in FIGS. 3A to 3C, it is necessary to supply the shift clocks, chip selection signal (enable signal), and power source to the shift register 24 in the memory unit in the memory module 12.

Therefore, the write/read unit 10 in FIG. 1 has a sine wave oscillator 30 for generating a sine wave signal of 435 kHz to supply a power source; a sine wave oscillator 32 for generating a sine wave signal of 450 kHz for shift clocks; and a sine wave oscillator 34 for generating a sine wave signal of 465 kHz to enable.

Outputs of the sine wave oscillators 30, 32, and 34 are input to a multiplexer 36. On the basis of a control signal which is supplied from a controller 38 using a CPU, the multiplexer 36 selects one of the sine wave signals generated from the oscillators 30, 32, and 34 and supplies it to one end of the induction coil 14 for transmission of the up-signals through an amplifier 40.

The controller 38 receives write information from a tape reader or the like which is connected to the outside and can transmit the read information read out of the memory module 12 to an external apparatus and can load it therein. That is, in the write access mode in which the write data input from the external apparatus such as a tape reader or the like is written into the memory module 12, the write data is converted into serial data synchronously with the internal clock and transmits same. On the other hand, in the read access mode, the controller 38 converts the serial data read out of the memory module 12 into parallel data synchronously with the internal clock and loads it into the external apparatus.

In the control of the multiplexer 36 by the controller 38, the memory module 12 is set to the standby mode prior to performing the write access or read access. Therefore, the frequency signal of 435 kHz from the sine wave oscillator 30 is first selected and supplied to one end of the induction coil 14 through the amplifier 40.

On the other hand, when the write access or read access is started, if the sync clock to serially transmit the write access data (including the write command and write addresses) or read access data (including the read command and read addresses) is set to "1", the frequency signal of 450 kHz for clocks is selected and is supplied to one end of the induction coil 14 through the amplifier 40. When the sync clock is set to "0", the frequency signal of 465 kHz to enable is selected and supplied to one end of the induction coil 14. In this manner, such switching operations are alternately repeated.

In other words, the multiplexer 36 modulates the sync clock bit of "1" for transmission/reception which is supplied from the controller 38 by the frequency signal of 450 kHz. The multiplexer 36 also modulates the sync clock bit of "0" by the frequency signal of 465 kHz. Further, when no sync clock is obtained, the frequency signal of 435 kHz for a power source is supplied to one end of the induction coil 14.

A transmission system for write access and read access from the controller 38 in the write/read unit 10 to the memory unit in the memory module 12 will now be described.

First, the write/read unit 10 has a multiplexer 60. The write access data (write command, write address, write data) or the read access data (read command, read address) is converted into serial data by the internal clock by the controller 38 and the serial bit data is output. The serial bit data is converted into a frequency signal by the multiplexer 60.

A sine wave oscillator 62 for generating frequency signal of 482 kHz indicative of the data bit "1" is connected to one input terminal of the multiplexer 60. The other input terminal of the multiplexer 60 is connected to ground to give a signal of a frequency 0 indicative of the data bit "0". Therefore, when the data bit "1" is received from the controller 38, the multiplexer 60 outputs a frequency signal of 482 kHz. On the other hand, when the data bit "0" is received, the multiplexer 60 outputs a signal of a frequency 0. That is, the multiplexer 60 outputs a signal indicative of the data bit "1" or "0" depending on the presence or absence of the frequency signal of 482 kHz.

The output of the multiplexer 60 is connected to the other end of the first induction coil 14 through an amplifier 64. Therefore, the induction coil 14 adds the frequency signal of 482 kHz obtained from the multiplexer 62 through the amplifier 64 to the frequency signal of 453 kHz for power source obtained from the multiplexer 36 through the amplifier 40, to the frequency signal of 450 kHz for clocks, or to the frequency signal of 465 kHz to enable. The resultant frequency signal is transmitted as the up-signal to the memory module 12.

In correspondence with the frequency signal which was time sharingly multiplexed after modulation by the frequency signals for power source, clocks, and enable which are supplied to the induction coil 14 of the write/read unit 10 and to the frequency modulated signal to write access or read access which is added to the multiplexed frequency signal, on the side of the memory module 12, there is provided a means for demodulating the operating power source, shift clocks, chip selection signal to enable, and write access data or read access data from the frequency modulated signal induced in the induction coil 18 by the induction coupling.

First, the output of the induction coil 18 is input to a rectifier 42. The rectifier 42 rectifies all of the frequency modulated signals induced in the induction coil 18 and supplies a power source voltage $+V_{cc}$ to each circuit section in the memory module 12.

On the other hand, the output of the induction coil 18 is supplied to a bandpass filter (BPF) 44 to select the frequency modulated signal of 450 kHz for clocks. The BPF 44 has a passband width of ±2 to 2.5 kHz for a center frequency of 450 kHz. Therefore, only the frequency modulated signal of 450 kHz for clocks can be taken out from the four frequency modulated signals of 435, 450, 465, and 482 kHz. An output of the BPF 44 is fed to a detecting circuit 46. The detecting circuit 46 demodulates a shift clock from the frequency modulated signal of 450 kHz. Furthermore, an output of the detecting circuit 46 is waveform shaped into a square wave signal by a waveform shaping circuit 48. The demodulated shift clock is supplied to the shift clock terminal SK of the shift register 24 in the memory unit.

On the other hand, the output of the induction coil 18 is input to a bandpass filter (BPF) 50 to select the frequency modulated signal of 465 kHz to enable. The BPF 50 has a passband width of ±2 to 2.5 kHz for the center frequency of 465 kHz. Therefore, only the frequency modulated signal of 465 kHz to enable can be taken out from the four frequency modulated signals of 435, 450, 465, and 482 kHz induced in the induction coil 18. An output of the BPF 50 is input to a detecting circuit 52. The detecting circuit 52 demodulates the clock signal to enable (the inverted signal of the shift clock) from the frequency modulated signal of 465 kHz. An output of the detecting circuit 52 is further waveform shaped by a waveform shaping circuit 54 and, thereafter, it is input to one input terminal of an OR gate 56. The shift clock from the waveform shaping circuit 48 is supplied to the other input terminal of the OR gate 56. The OR gate 56 logically OR's the shift clock and enable clock, thereby forming an enable signal to the chip selecting terminal CS of the shift register 24.

Figure 4A:
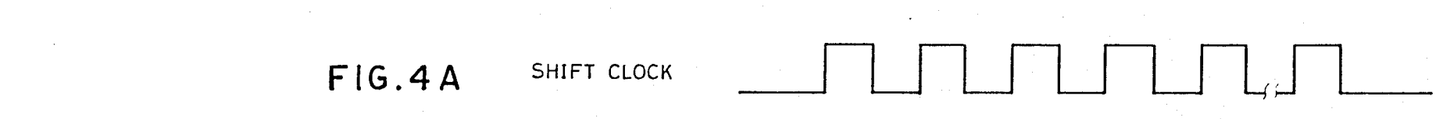
FIG. 4A is a signal waveform diagram of sync clocks which are reproduced by the memory module.
Figure 4B:
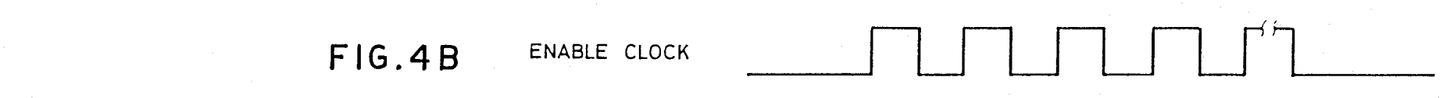
FIG. 4B is a signal waveform diagram of enable clocks which are reproduced by the memory module.
Figure 4C:
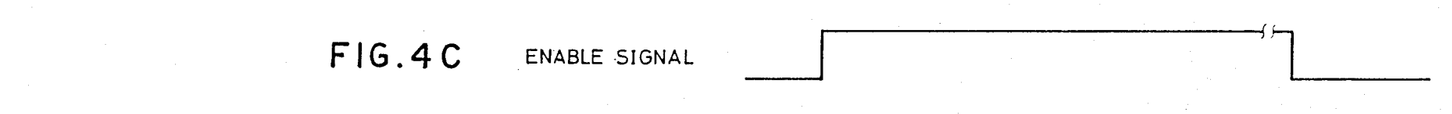
FIG. 4C is a signal waveform diagram of an enable signal which is produced by the memory module.

That is, the shift clocks shown in FIG. 4A and the enable clocks shown in FIG. 4B are input to the OR gate 56. Therefore, by ORing those clocks, the enable signal supplied to the chip selecting terminal CS, as shown in FIG. 4C, can be produced.

Therefore, in the write access or read access mode of the memory module 12, the frequency signal of 450 kHz for clocks is selected by the bit "1" of the sync clock obtained from the controller 38 by the multiplexer 36 provided in the write/read unit 10. On the other hand, the frequency signal of 465 kHz to enable is selected by the bit "0" of the sync clock. For the period of time when the enable clocks are obtained, the OR gate 56 in the memory module 12 sets the chip selecting terminal CS to the H level, so that the enable state to write or read can be set as shown in FIG. 3.

Furthermore, the signal induced in the induction coil 18 is input to a bandpass filter (BPF) 70. The BPF 70 has a passband width of ±2 to 2.5 kHz for the center frequency of 482 kHz. Therefore, only the frequency modulated signal of 482 kHz to write access or read access which was induced in the induction coil 18 can be selected. An output of the BPF 70 is input to a detecting circuit 72. A data bit is demodulated from the frequency signal of 482 kHz by the detecting circuit 72. Furthermore, an output signal of the detecting circuit 72 is waveform shaped into a rectangular wave signal by a waveform shaping circuit 76. Thereafter, the demodulated data bit is input to the serial data input terminal DI of the shift register 24 in the memory unit.

A transmission system for the write/read unit 10 of the read data which was read out of the non-volatile memory 22 in the memory module 12 will now be described.

When the read access is transmitted to the memory unit in the memory module 12 by the transmission system of the up-signals by the induction coils 14 and 18, the serial bit data (read data) is output from the serial data output terminal DO of the shift register 24. To return the serial bit data to the write/read unit 10, a sine wave oscillator 78 for generating a sine wave signal of 482 kHz to frequency modulate the bit data is provided. An output of the sine wave oscillator 78 is input to the fourth induction coil 20 through an amplifier 80 and an analog switch 82. The analog switch 82 is turned on or off on the basis of the bit data obtained from the serial data output terminal DO of the shift register 24. When the data bit is set to "1", the analog switch 82 is turned on to supply the sine wave signal of 482 kHz to the induction coil 20. When the data bit is set to "0", the analog switch 82 is turned off to inhibit the supply of the sine wave signal of 482 kHz to the induction coil 20. By the on/off control of the analog switch 82 according to the serial data bit, the serial bit data obtained from the serial data output terminal DO of the shift register 24 is converted into the frequency signal of 482 kHz in response to the bit "1" and into the signal of frequency "0" in response to the bit "0".

The induction magnetic field due to the supply of the frequency modulated signal for the induction coil 20 for down-transmission in the memory module 12 is induced in the third induction coil 16 in the write/read unit 10. After the output of the induction coil 16 was amplified by an amplifier 86, it is fed to a bandpass filter (BPF) 88.

The BPF 88 has a passband width of ±2 to 2.5 kHz for the center frequency of 482 kHz. The BPF 88 selects the frequency modulated signal from the memory module 12 which was induced in the induction coil 16 and inputs it to a detecting circuit 90. Data bits are demodulated by the detecting circuit 90 and the serial bits of the read data are fed to the controller 38.

The writing operation for the memory module 12 in the embodiment of FIG. 1 will now be described with reference to a flowchart of FIG. 5.

First, prior to performing the write access operation, the memory module 12 is activated in step 501. That is, in the write/read unit 10, the multiplexer 36 selects the frequency signal of 435 kHz for a power source in response to a control signal from the controller 38. The signal is then amplified by the amplifier 40 and supplied to one end of the induction coil 14. In this case, since no frequency signal is supplied from the amplifier 64 to the other end of the induction coil 14, this state corresponds to that the other end through the induction coil 14 is connected to the ground of the amplifier 64. The frequency signal of 435 kHz is supplied from the amplifier 40 to the induction coil 14 and the induction magnetic field corresponding to the frequency signal is generated.

The frequency modulated signal of 435 kHz by the induction coil 14 is induced in the induction coil 18 in the memory module 12 and rectified by the rectifier 42, so that a power source voltage $+V_{cc}$ for making each circuit section in the memory module 12 operative is obtained.

Subsequently, as shown in step 502, the chip selecting terminal CS of the shift register 24 in the memory module 12 is set to the H level, thereby obtaining the enable state. The chip selecting terminal CS is set to the H level by selecting the frequency signal of 465 kHz to enable by the multiplexer 36. The frequency signal of 465 kHz induced in the induction coil 18 is demodulated by the bandpass filter 50, detecting circuit 52, and waveform shaping circuit 54. The chip selecting terminal CS of the shift register 24 is set to the H level through the OR gate 56, thereby producing the enable state.

Then, as shown in step 503, the serial communication of the write access data consisting of a write command, write addresses, and write data by the controller 38 is started.

The serial communication is started or stopped by turning on or off the frequency signal of 450 kHz for clocks by the multiplexer 36 synchronously with the clocks which are output from the controller 38. Thus, the multiplexer 36 selects the frequency signal of 450 kHz for clocks for the sync clock bit "1" and selects the frequency signal of 465 kHz to enable for the sync clock bit "0". Therefore, in the memory module 12, the clock signal based on the frequency signal of 450 kHz is demodulated by the bandpass filter 44, detecting circuit 46, and waveform shaping circuit 48 and supplied to the shift clock terminal SK of the shift register 24. At the same time, by receiving the OR output of the shift clock and enable clock from the OR gate 56, the chip selecting terminal CS of the shift register 24 is held at an H level, thereby setting the memory unit into the enable state.

Subsequently, as shown in step 504, the controller 38 converts the write information, that is, the parallel data consisting of a write command, write addresses, and write data into the serial data synchronously with the internal clocks and controls the multiplexer 60. At this time, if the data bit is set to "1", the multiplexer 60 selects the frequency signal of 482 kHz. When the data bit is set to "0", the multiplexer 60 selects the frequency zero signal.

Since the first bit of the write command is the data bit "1" as shown in FIG. 3B, the multiplexer 60 first selects the frequency signal of 482 kHz and supplies to the other end of the induction coil 14 through the amplifier 64. At this time, since the frequency signal of 450 kHz for clocks is supplied from the amplifier 40 to one end of the induction coil 14, the induction coil 14 generates the induction magnetic field including the frequency component in which the frequency signals of 482 kHz and 450 kHz were added.

The frequency component of 482 kHz which is induced in the induction coil 18 in the memory module 12 and serves as the first bit of the write information is demodulated by the bandpass filter 70, detecting circuit 74, and waveform shaping circuit 76 and supplied to the serial data input terminal DI of the shift register 24. At the same time, the shift clock based on the demodulated output of the frequency signal component of 450 kHz selected by the multiplexer 36 synchronously with the first bit of the write command is fed to the shift clock terminal SK of the shift register 24. Therefore, the shift register 24 reads the first bit of the write command fed to the serial data input terminal DI synchronously with the shift clock.

Subsequently, in step 505, a check is made to see whether or not all of the bits of the write access data have been transmitted. In this case, since the first bit is transmitted, the processing routine advances to step 506 and a count value n of a bit counter is increased by "1". Then, step 504 again follows and the next second bit is transmitted.

In this manner, after all of the bits from the write command to the write data have been serially transmitted, the processing routine advances from step 505 to step 507 and the write data converted into the parallel data by the shift register 24 is written into the non-volatile memory 22.

Practically speaking, by inhibiting the selection of the frequency signal of 465 kHz to enable by the multiplexer 36, the enable clock obtained through the OR gate 56 is set to the L level and an chip selecting terminal CS is set to an L level. Therefore, the write data stored in the shift register 24 can be written into the non-volatile memory 22.

Figure 6:
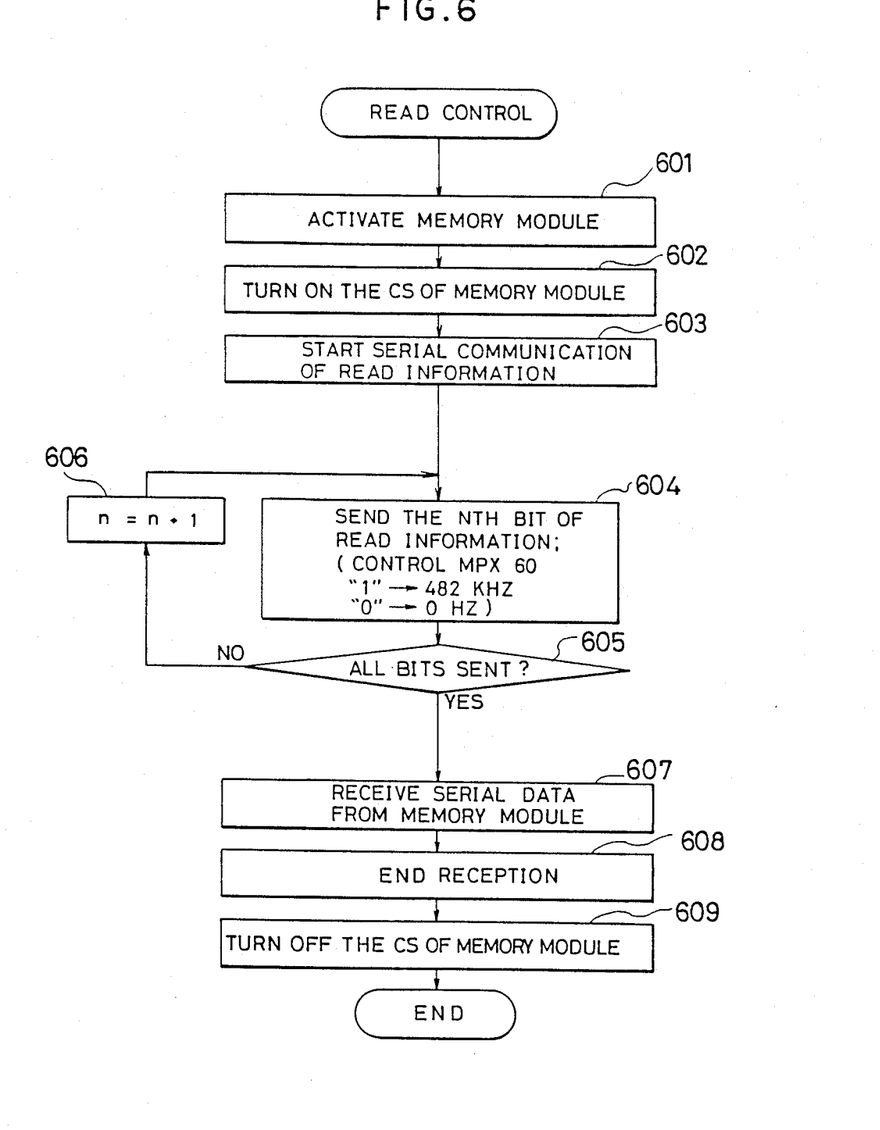
FIG. 6 is a flowchart showing the read access in FIG. 1.

The reading operation will now be described with reference to a flowchart of FIG. 6.

Figure 5:
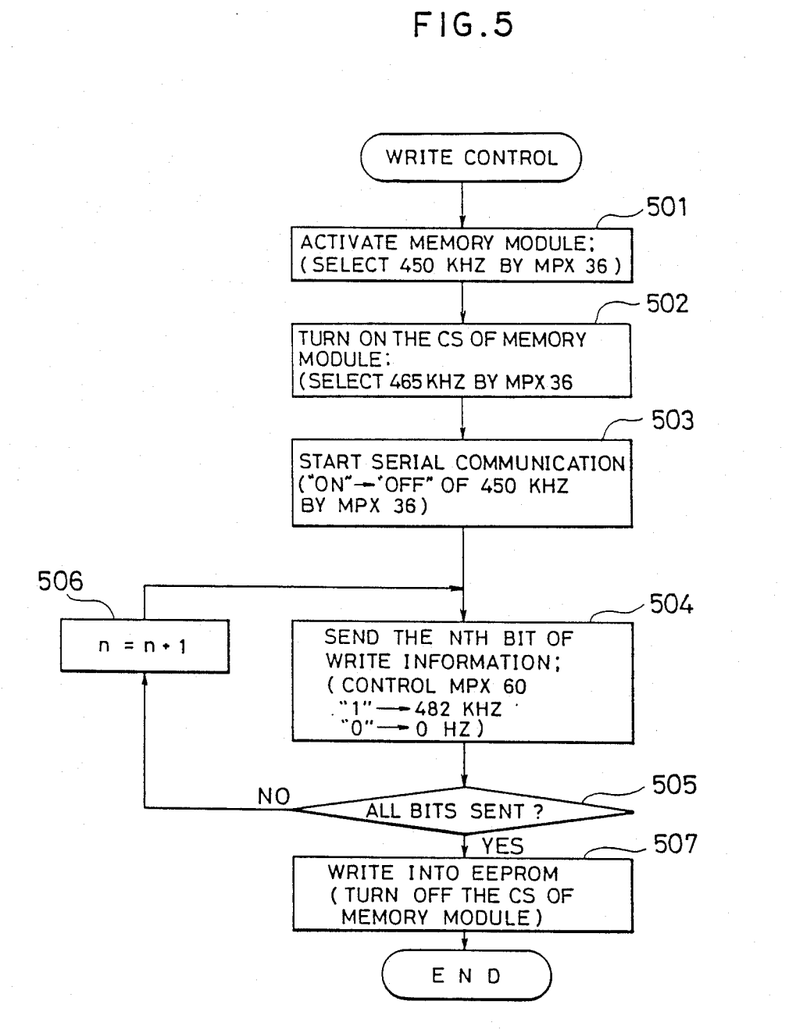
FIG. 5 is a flowchart showing the write access in FIG. 1.

First, the activation of the memory module shown in step 601 and the setting to the H level of the chip selecting terminal CS in the memory module shown in step 602 are the same as the processes in steps 501 and 502 for the write control shown in FIG. 5.

In the next step 603, the serial communication of the read access information (read command and read addresses) is started.

That is, as shown in step 604, by selecting the frequency signal by the multiplexer 60 in response to the first bit of the read information, namely, the first bit of the read command, the first bit of the read command converted into the frequency signal of 482 kHz for the bit "1" and into the frequency zero signal for the bit "0" is transmitted to the memory module 12. After completion of the transmission of the first bit of the read command, the processing routine advances from step 605 to step 606 and the count value n of the bit counter is increased by "1". In a manner similar to the above, the bits of the read command and read addresses are sequentially frequency modulated and sent to the memory module 12.

After all of the data bits of the read command and read addresses were serially transmitted from the write/read unit 10, the memory unit in the memory module 12 reads out the data in the instruction addresses from the non-volatile memory 22 to the shift register 24 on the basis of the read command and read addresses obtained from the shift register 24. The output of the serial bits of the read data from the serial data output terminal DO is started synchronously with the shift clock to the shift clock terminal SK.

That is, when the data bit which is output from the serial data output terminal DO of the shift register 24 is set to "1", the analog switch 82 is turned on to supply the frequency signal of 482 kHz to the induction coil 20. If the data bit is set to "0", the analog switch 82 is turned off to stop the output of the frequency signal of 482 kHz to the induction coil 20.

Upon reception of the induction magnetic field due to the frequency modulated signal of the read data supplied to the induction coil 20, the frequency modulated signal corresponding to the read data bit is induced in the induction coil 16 in the write/read unit 10. After the signal of the induction coil 16 was amplified by the amplifier 86, it is demodulated by the band pass filter 88 and detecting circuit 90 and sent to the controller 38 (step 607).

After the reception of all of the read data from the memory module 12 was finished in the next step 608, the controller 38 inhibits the selection of the frequency signal of 465 kHz to enable by the multiplexer 36. Thus, as shown in step 609, the supply of the enable signal to the chip selecting terminal CS of the shift register 24 in the memory module 12 is stopped. A series of reading operations are finished.

Further, with respect to the erase control for the memory module 12, the data in the designated address in the non-volatile memory 22 can be erased by the similar processes except the transmission of the write data shown in the flowchart of FIG. 5.

Moreover, as shown in FIG. 2, as the induction coils 14 and 18 for up-signals, the coils of large diameters wound in the coil grooves 102 and 202 on the outer peripheral sides of the magnetic cores 100 and 200 are used. Therefore, even if the gap length of the magnetic induction coupling is extended to the predetermined maximum gap length, e.g., 5 mm, the induction magnetic field of an enough intensity can be generated, so that the frequency modulated signals for power source, clocks, enable, and write/read control can be certainly transmitted from the write/read unit 10 to the memory module 12.

On the other hand, with regard to the induction coils 16 and 20 for the down-signal to transmit the read data from the memory module 12 to the write/ read unit 10, the coils of the small diameters wound in the coil grooves 104 and 204 on the inner peripheral side of the magnetic cores 100 and 200 are used as shown in FIG. 2. Therefore, the intensity of the induction magnetic field is smaller than that in the case of the induction coils 14 and 18 for up-transmission. However, since the induction signal of the induction coil 16 is amplified by the amplifier 86 and, thereafter, it is reproduced, even if the gap length increases by raising the amplification gain of the amplifier 86, the frequency modulated signal corresponding to the read data can be certainly received and demodulated.

What is claimed is:

1. A memory package system for performing one of a data writing or data reading operation by a serial data transmission by a contactless coupling system using induction coils between a memory modulate having therein a (non-volatile) memory and a write/read unit, wherein said write/read unit comprises:
(a) a first induction coil for transmission of up-signals;
(b) a second induction coil for reception of a down-signal;
(c) a control data transmitting means for frequency modulating a power source signal, a sync clock signal, and an enable clock signal which are transmitted to said memory package and, thereafter, time sharingly multiplexing and for outputting same to one end of said first induction coil;
(d) an access data transmitting means for frequency modulating serial bit data of each of write access data including a write command, write addresses, and one of write data or read access data including a read command and read addresses for said memory package and for outputting same to another end of said first induction coil';and
(e) a read data receiving means for demodulating read data from an induction signal when a frequency modulated signal of the read data from the memory module was induced in said second induction coil;

and said memory module comprises:
(i) a third induction coil for reception of up-signals which is arranged so as to face said first induction coil in said write/read unit;
(ii) a fourth induction coil for transmission of a down-signal which is arranged so as to face said second induction coil in said write/read unit;
(iii) a rectifying means for rectifying all frequency modulated signals of said power source signal, sync clock signal, enable clock signal, and write or read access data which were included in said third induction coil and for supplying a DC operating electrical power;
(iv) a control data receiving means for individually demodulating sync clocks and enable clocks from frequency modulated signals induced in said third induction coil and for outputting said sync clocks and enable signal;
(v) an access data receiving means for demodulating said write command, write addresses, and write data from frequency modulated signals induced in said third induction coil in a write access mode, and for demodulating said read command and read addresses in a read access mode;
(vi) a memory control means which is made operative by receiving said sync clocks and enable signal reproduced by said control data receiving means and for performing one of a writing or reading operation for said memory on the basis of write access data or read access data obtained from said access data receiving means; and
(vii) a read data transmitting means for frequency modulating serial bit data read out of the memory by said reading operation by said memory control means and for supplying same to said fourth induction coil.

2. A memory package system according to claim 1, wherein each of the write/read unit and the memory module has a magnetic core concentrically having two coil grooves, said first and third induction coils consisting of coils of large diameters wound in said coil grooves on an outer peripheral side of each of said magnetic cores, and said second and fourth induction coils consisting of coils of small diameters wound in said coil grooves on an inner peripheral side of each of said magnetic cores.

3. A memory package system according to claim 1, wherein said control data transmitting means provided in said write/read unit comprises:
a first oscillator for generating a signal of a frequency $f_1$ for a power source;
a second oscillator for generating a signal of a frequency $f_2$ for clocks;
a third oscillator for generating a signal of a frequency $f_3$ for enable clocks; and
a first multiplexer for selecting an output of said first oscillator in a standby mode, and for selecting an output of said second oscillator in response to bit "1" of the sync clock, and for selecting an output of said third oscillator in response to bit "0" of the sync clock.

4. A memory package system according to claim 1, wherein said access data transmitting means provided in said write/read unit comprises:
a fourth oscillator for generating a signal of a frequency $f_4$ to access; and
a second multiplexer for selecting an output of said fourth oscillator in response to a data bit "1" of the serially converted write access data or read access data, and for inhibiting the output of the fourth oscillator in response to a data bit "0".

5. A memory package system according to claim 1, wherein said control data receiving means in said memory module comprises:
an enable signal generating means for generating an enable signal for said memory control means on the basis of a logic OR combination of the demodulated sync clock and enable clock.

6. A memory package system according to claim 1, wherein said memory control means in said memory module comprises:
a shift register for reading the write access data or read access data which is output from said access data receiving means as serial bit data in response to the sync clock by receiving the enable signal from said control data receiving means, and for converting same into parallel data and outputting same;
an instruction decoder for decoding an access command which is output from said shift register; and
an address decoder for decoding an instruction address which is output from the shift register.

* * * * *